(12) United States Patent
Chossat et al.

(10) Patent No.: US 11,181,940 B2
(45) Date of Patent: Nov. 23, 2021

(54) DEVICE FOR DETECTING A FAULT IN CIRCUIT PROPAGATING A CLOCK SIGNAL, AND CORRESPONDING METHOD

(71) Applicant: STMicroelectronics (Grenoble 2) SAS, Grenoble (FR)

(72) Inventors: Jerome Chossat, Voiron (FR); Stephane Drouard, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 192 days.

(21) Appl. No.: 16/512,696

(22) Filed: Jul. 16, 2019

(65) Prior Publication Data

US 2020/0033907 A1     Jan. 30, 2020

(30) Foreign Application Priority Data

Jul. 24, 2018   (FR) ...................................... 1856820

(51) Int. Cl.
*G06F 1/08*      (2006.01)
*H03K 19/21*      (2006.01)
*H03K 5/156*      (2006.01)
*G06F 11/277*      (2006.01)

(52) U.S. Cl.
CPC .............. *G06F 1/08* (2013.01); *G06F 11/277* (2013.01); *H03K 5/1565* (2013.01); *H03K 19/21* (2013.01)

(58) Field of Classification Search
CPC ..... G06F 1/04; G06F 1/06; G06F 1/08; G06F 1/10; G06F 1/12; H03K 5/131; H03K 5/133; H03K 5/135; H03K 19/20; H03K 19/21; H03K 19/0016; H03K 19/0963; H03K 19/1766; H03K 19/1737
See application file for complete search history.

(56) References Cited

U.S. PATENT DOCUMENTS

| 4,542,509 | A | 9/1985 | Buchanan et al. |
| 5,498,983 | A | 3/1996 | Schoellkopf |
| 8,937,496 | B1 | 1/2015 | Ahmad et al. |
| 2007/0280032 | A1* | 12/2007 | Kwak ..................... G11C 7/222 365/233.5 |

FOREIGN PATENT DOCUMENTS

EP     0262330 A2     7/1987
FR     2711286 A1     4/1995

* cited by examiner

*Primary Examiner* — John W Poos
(74) *Attorney, Agent, or Firm* — Slater Matsil, LLP

(57) ABSTRACT

An electronic circuit includes a clock signal generator configured to deliver a clock signal. A propagation circuit is configured to propagate the clock signal on a plurality of propagation branches. A number of timers are coupled to at least some of the branches. The timers are clocked by corresponding replicas of the clock signal and configured to generate a pulse signal every N pulses of the corresponding replica of the clock signal. A comparator is configured to generate an alarm signal having a first state when two of the pulse signals are phase-offset with respect to one another.

22 Claims, 6 Drawing Sheets

DEVICE FOR DETECTING A FAULT IN CIRCUIT PROPAGATING A CLOCK SIGNAL, AND CORRESPONDING METHOD

CROSS-REFERENCE TO RELATED APPLICATIONS

This application claims priority to French Patent Application No. 1856820, filed on Jul. 24, 2018, which application is hereby incorporated herein by reference.

TECHNICAL FIELD

Embodiments of the invention relate to a device for detecting a fault in a circuit propagating a clock signal.

BACKGROUND

Fault injection disrupts the operation of an integrated circuit. It may be carried out intentionally, for example, for the purpose of recovering secure information and/or accessing protected functions of the circuit.

In an attack using fault injection, for example, into a clock signal propagation circuit, an attacker generates an electromagnetic pulse using a probe placed near the integrated circuit.

When the probe is placed near a metal track, for example, a metal track of the clock signal propagation circuit, a corresponding voltage pulse is generated in the metal track.

This voltage pulse, which is normally shorter than a pulse of the clock signal, may be interpreted as a normal clock pulse by the electronic circuit. Thus, following such an event, the clock signal may contain a stray clock pulse that reduces the distance between 2 successive clock edges, which may lead to the violation of a critical path in the circuit and cause a malfunction.

For example, a critical processor path could be violated, leading to execution different from the one that is expected. This may be highly problematic if the program code corresponds to security operations, for example, a data access control protocol intended to adopt precise behavior (for example generate an alert signal) if access is denied. In this case, if the program is interrupted, the precise behavior will not be able to be adopted and the attacker will be able to access the data.

One conventional example of a circuit that may be the target of an attack through fault injection is an integrated circuit in a chip card, for example a bank card.

In other applications, it is possible for the fault not to be injected intentionally by an attacker, but for it to arise randomly from the environmental conditions in which the integrated circuit is operating.

It would be possible for example for the fault to arise from electromagnetic interference or for it to be generated through interaction with a high-energy particle, such as for example a gamma or alpha particle.

This type of malfunction is common in automotive, aeronautical or space applications, which is why there are strict standards that stipulate sufficient resistance to this type of malfunction. For example, the standard "ISO 26262" regarding the operational safety of road vehicles stipulates safety conditions to be complied with regarding electronic appliances in automotive applications.

There are means for monitoring the occurrence of such attacks, for example by monitoring the clock signal. That being said, these solutions require the use of an additional clock signal, which exhibits several drawbacks, such as for example inaccuracies in the monitoring clock signal due to variations in manufacturing process conditions, temperature and power supply.

These monitoring means also exhibit problems in terms of production complexity, in particular because they require the production of a duplicate clock circuit on which the monitoring clock signal will flow.

SUMMARY

Embodiments of the invention relate to electronic circuits and, in particular embodiments, to the detection of a fault that is generated randomly or injected intentionally for example into the clock signal propagation circuit of the integrated circuit.

Embodiments of the invention provide a way of detecting an intentional or random fault injection that is easy to produce and reliable enough to ensure sufficient security of the electronic circuits.

According to one aspect, an integrated electronic circuit includes a clock signal generator configured so as to deliver a clock signal. A propagation circuit is configured so as to propagate the clock signal on a plurality of propagation branches.

This circuit includes a device for detecting a potential anomaly in the clock signal, including a plurality of timers coupled to at least some of the branches, clocked by corresponding replicas of the clock signal flowing on the branches, and configured so as to generate a pulse signal every N pulses of the corresponding replica of the clock signal, the device furthermore comprising a comparator configured so as to generate an alarm signal having a first state if at least two of the pulse signals are phase-offset with respect to one another.

The pulses of the corresponding replicas of the clock signal flowing on the branches contain the pulses of the clock signal and possibly one or more pulses arising from an intentional or unintentional injection of a fault or faults into the clock propagation circuit.

N is typically greater than 1, and may preferably be equal to 8 or to 16.

The production of an additional monitoring clock circuit is thus dispensed with here, since the propagation circuit is not monitored in its entirety here, but only the output of the propagation circuit is monitored.

The timers and the comparator furthermore allow the device to be produced easily.

According to one embodiment, the comparator includes a plurality of input terminals and a single output terminal that is configured so as to deliver the alarm signal, and a plurality of logic circuits connected in cascade, each input terminal of the comparator being coupled to a separate input of a logic circuit.

The production of the comparator using logic circuits coupled in cascade is particularly easy and does not require significant modifications in the design of the circuit.

The logic circuits may include a single output and be connected in series, such that an initial logic circuit has its inputs coupled to two separate timers, the other logic circuits having one input coupled to the output of a separate logic circuit and a second input coupled to a separate timer, a terminal logic circuit having its output coupled to the output terminal.

The terminal logic circuit may be an Exclusive OR logic gate, the other logic circuits being OR logic gates.

Each logic circuit may have its output coupled to the output terminal and be configured so as to generate an alarm signal.

According to one embodiment, the logic circuits each include a single output and are coupled in a tree structure.

The logic circuits may be Exclusive OR gates, the output of at least one logic circuit being coupled to the output terminal.

The output of each logic circuit may be coupled to the output terminal.

According to one aspect, what is proposed is a motor vehicle including at least one electronic system comprising a circuit such as described above.

According to one aspect, what is proposed is a system comprising an integrated circuit such as described above and furthermore including a storage medium containing secure data. This system may for example be a chip card.

According to another aspect, a method for detecting an anomaly in a clock signal propagating replicas of a clock signal on a plurality of branches of a propagation circuit, generating, at the ends of at least some of the branches of the propagation circuit, pulse signals every N pulses of the corresponding replica, and detecting a mutual phase offset between at least two pulse signals. The phase offset is representative of the presence of an anomaly in at least one of the replicas of the clock signal flowing on the branches.

A phase offset is understood here and in the remainder of the description to be a time difference between the at least two signals.

BRIEF DESCRIPTION OF THE DRAWINGS

Other advantages and features of the invention will become apparent upon examining the detailed description of completely non-limiting embodiments of the invention and the appended drawings, in which.

DETAILED DESCRIPTION OF ILLUSTRATIVE EMBODIMENTS

Figure 1:
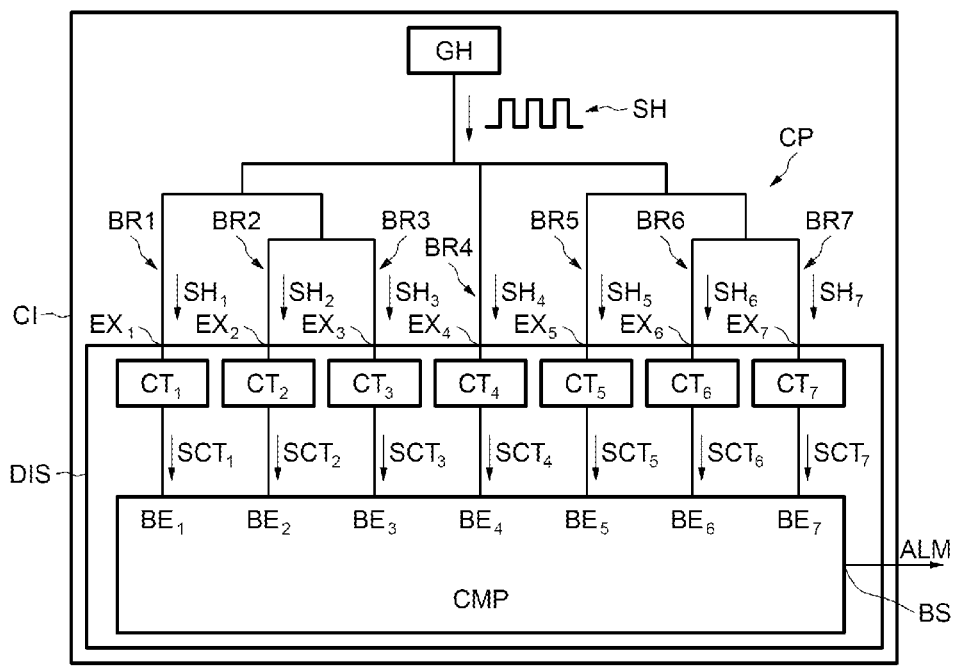
FIGS. 1 to 11 illustrate embodiments of the invention.

FIG. 1 is a schematic depiction of an integrated circuit CI according to one embodiment of the invention. The integrated circuit CI includes a clock signal generator GH, configured so as to deliver a clock signal SH having a first frequency.

The clock signal generator may be for example a piezoelectric quartz-based oscillator comprising a phase-locked loop.

The generator GH is coupled in this case to a propagation circuit CP for propagating the clock signal SH into various zones of the integrated circuit. The propagation circuit is produced in a conventional manner and includes vias and metal tracks produced in the interconnect portion of the integrated circuit (BEOL, back end of line as it is well known in the art) and intermittently connecting components that are produced in the substrate of the integrated circuit.

The propagation circuit CP has in this case, as is conventional, a tree structure the root of which is coupled to the clock generator GH and each branch $BR_i$ of which propagates a corresponding replica $SH_i$ of the clock signal SH. Depending on their length, the various branches $BR_i$ may comprise a delay element (not shown), for example, inverting or non-inverting buffers, for maintaining synchronous operation of the integrated circuit.

The branches of the propagation circuit, and in particular their ends $EX_i$, that is to say the portions of the propagation circuit that connect the components of the integrated circuit, in this case contacts made of tungsten, are thus each configured so as to deliver a replica $SH_i$ of the clock signal SH.

The ends $EX_i$ of the branches $BR_i$ of the propagation circuit CP are coupled in this case to a device DIS for monitoring for a potential fault injection into the integrated circuit.

Fault injection is understood here and in the remainder of the description to mean any intentional injection of a fault by an attacker, for example by generating an electromagnetic pulse near the circuit CI leading to a voltage pulse in the propagation circuit CP, or else any unintentional injection of a fault, on account for example of a random phenomenon depending on the environment in which the integrated circuit is situated and exhibiting similar effects on the integrated circuit, such as for example an emission of alpha or gamma particles leading to a voltage pulse in the propagation circuit CP.

The device DIS includes a plurality of timers $CT_i$, each of which is coupled to one end $EX_i$ of a separate branch of the propagation circuit so as to receive a replica of the clock signal $SH_i$. A comparator CMP includes a plurality of inputs $BE_i$ each coupled to the output of a separate timer $CT_i$, and an output terminal BS configured so as to deliver an alarm signal ALM having a default state, in this case a low state, if no fault is detected and having a first state, in this case a high state, if a fault is detected.

The timers $CT_i$ are each configured so as to generate, in the absence of a fault, a pulse signal $SCT_i$ every N cycles of a corresponding replica of the clock signal $SH_i$.

In this case, the timers are configured so as to generate a pulse every 3 clock cycles, for example.

It would be possible to choose an arbitrary number N of clock cycles, and a person skilled in the art will know how to choose this number according to the desired accuracy and the consumption constraints under consideration.

During normal operation of the integrated circuit CI, that is to say in the absence of a fault, the timers $CT_i$ are therefore configured so as to deliver pulse signals $SCT_i$ having zero phase offset with respect to one another, and the comparator is configured so as to generate the alarm signal in its default state.

Figure 2:
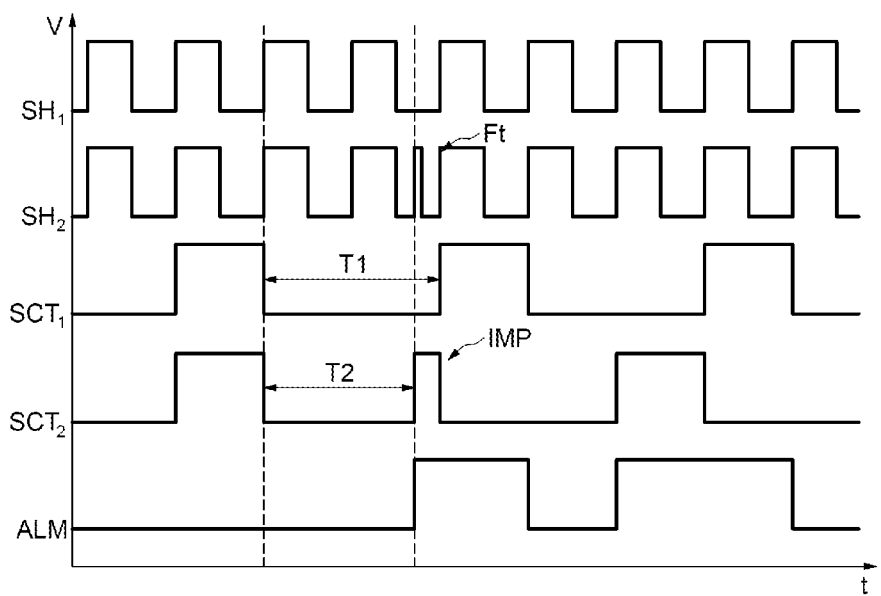

FIG. 2 illustrates the temporal evolution of a first replica $SH_1$ of the clock signal SH into which no fault has been injected, of a second replica $SH_2$ of the clock signal SH into which a fault Ft has been injected, of the pulse signals $SCT_1$ and $SCT_2$ generated by a first timer $CT_1$ and a second timer $CT_2$, respectively, and of the alarm signal ALM.

In this case, the first timer $CT_1$ receives the first replica $SH_1$, and the second timer receives the second replica $SH_2$.

The first timer $CT_1$ delivers a pulse every 3 pulses of the first replica $SH_1$, for example on the rising edges of the first replica $SH_1$ of the clock signal SH.

It may therefore be considered, for the sake of understanding the invention, that the pulses of the first pulse signal $SCT_1$ are generated in a first period $T_1$.

The second timer $CT_2$ is also configured so as to deliver a pulse every 3 cycles of the clock signal, but, since the second replica $SH_2$ contains a fault Ft, in this case an additional pulse, the latter is processed by the timer as a pulse of the second replica $SH_2$, and the pulse IMP of the second pulse signal $SCT_2$ following the injection of the fault Ft is generated earlier, at the end of a duration $T_2$ after the previous pulse.

Plus, since the pulses of the pulse signals in this case have a duration of one clock signal cycle, this leads to shortening of the duration of the pulse IMP. In this case, the pulse IMP has a duration Δ equal to T1-T2.

As the two timers $CT_1$ and $CT_2$ are continuously desynchronized, they will generate phase-offset output signals at a regular interval. In this case, the first signal $SCT_1$ and the second signal $SCT_2$ are phase-offset by one clock signal cycle.

Upon detecting this phase offset, the comparator CMP will change the alarm signal ALM from its default state to its first state.

The alarm signal may be delivered for example to a circuit for controlling the integrated circuit CI, which is configured so as to reset the integrated circuit CI when receiving the alarm signal in its first state.

Security of the integrated circuit is thus ensured. It should be noted in this case that such a device DIS does not prevent the occurrence of a fault injection, but prevents operation of the integrated circuit CI from continuing in the event that a fault injection takes place.

This approach allows the circuit to be protected using simple circuits.

Furthermore, by dispensing with a monitoring clock signal, a protection device with improved reliability is obtained.

Figure 3:
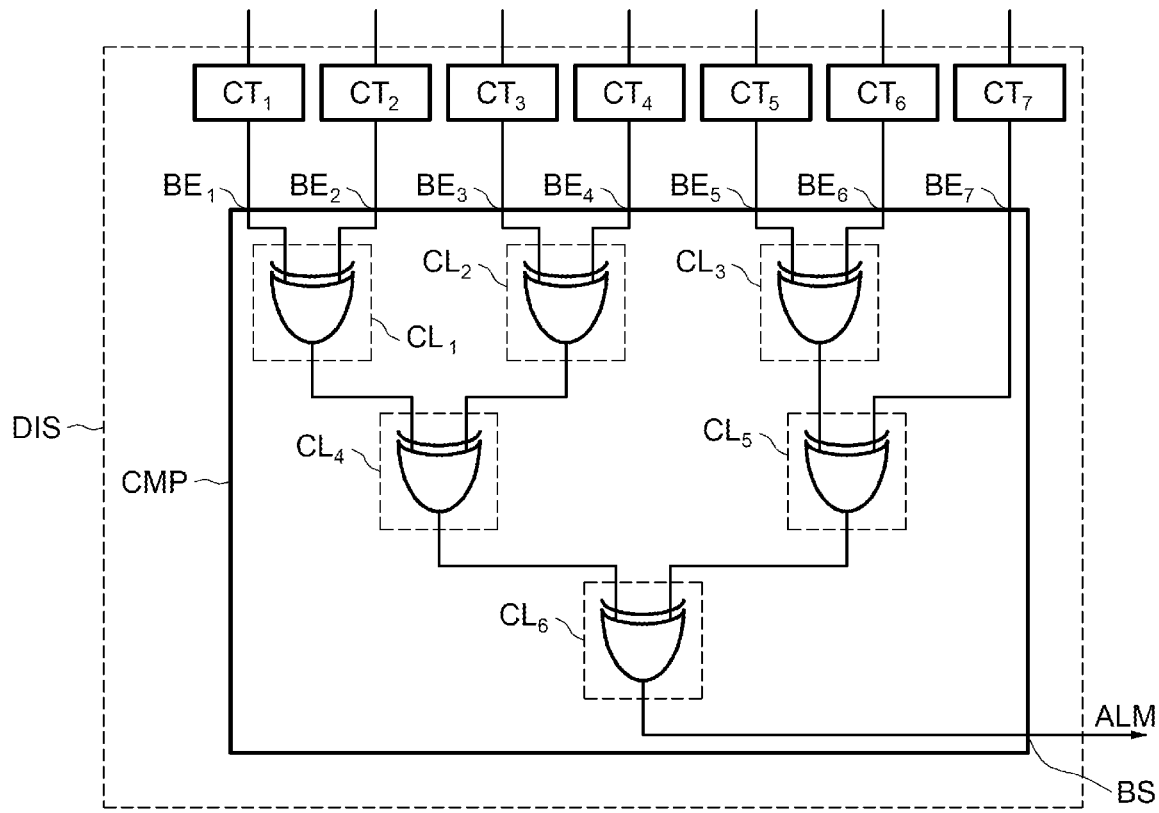
Figure 4:
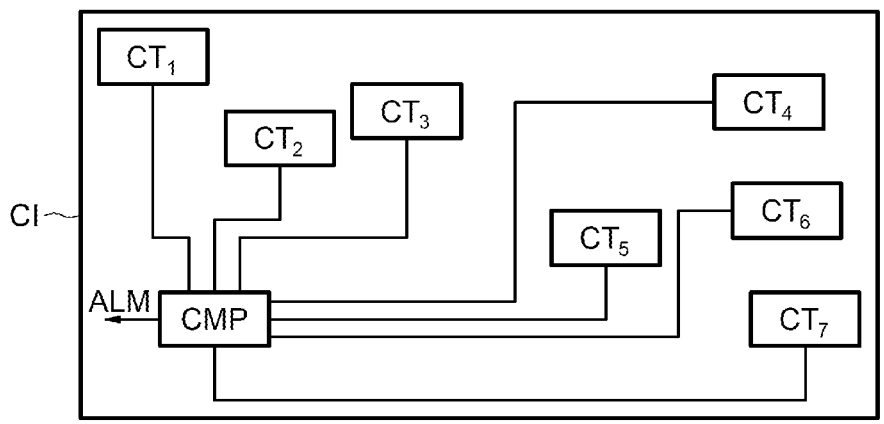

FIG. 3 illustrates one particular embodiment of the comparator CMP, and FIG. 4 is a schematic plan view of an integrated circuit CI illustrating one exemplary layout of the various elements of the device DIS according to the embodiment of FIG. 3.

In this embodiment, the comparator CMP includes a plurality of logic circuits $CL_j$, in this case Exclusive OR logic gates, connected in cascade in a tree structure the root of which is coupled to the output terminal of the comparator.

In this case, the inputs of a first logic gate $CL_1$, of a second logic gate $CL_2$ and of a third logic gate $CL_3$ are coupled to the input terminals $BE_1$ to $BE_6$ of the comparator CMP, so as to receive the pulse signals $SCT_1$ and $SCT_2$, $SCT_3$ and $SCT_4$, $SCT_5$ and $SCT_6$, respectively.

The output of the first logic gate $CL_1$ and the output of the second logic gate $CL_2$ are coupled in this case to the input of a fourth logic gate $CL_4$, and the output of the third logic gate $CL_3$ is coupled to the input of a fifth logic gate $CL_5$. The second input of the fifth logic gate $CL_5$ is coupled in this case to an input terminal $BE_7$ of the comparator, so as to receive the pulse signal $SCT_7$ from the seventh timer $CT_7$.

A sixth logic gate $CL_6$ has its inputs coupled to the outputs of the fourth and fifth logic gates $CL_4$ and $CL_5$ and its output coupled to the output terminal BS of the comparator CMP. The logic gate $CL_6$ therefore forms a terminal logic gate of the cascade tree.

Each logic gate is thus configured so as to deliver a signal having a low state if the signals that it receives on its inputs are identical or not phase-offset, and so as to deliver the signal having a high state when the two signals that it receives on its inputs are different or phase-offset.

For example, for the logic gates $CL_1$ to $CL_3$, when the pulse signals on their inputs are phase-offset, the signal on the output of the logic gate under consideration will be in a high state.

If a phase offset is detected, the high state will be propagated to the subordinate logic gates (in this case $CL_4$, $CL_5$ or $CL_6$), which will, for their part, generate a high state.

The signal generated by the logic gate situated at the root of the tree, in this case the logic gate $CL_6$, forms the alarm signal ALM, which is therefore in its default state, in this case a low state, if no phase offset has occurred, and in its first state, in this case a high state, if a phase offset has occurred.

In FIG. 4, the timers $CT_i$ are distributed over the entire surface area of the integrated circuit, and are each coupled to the comparator CMP.

Figure 5:
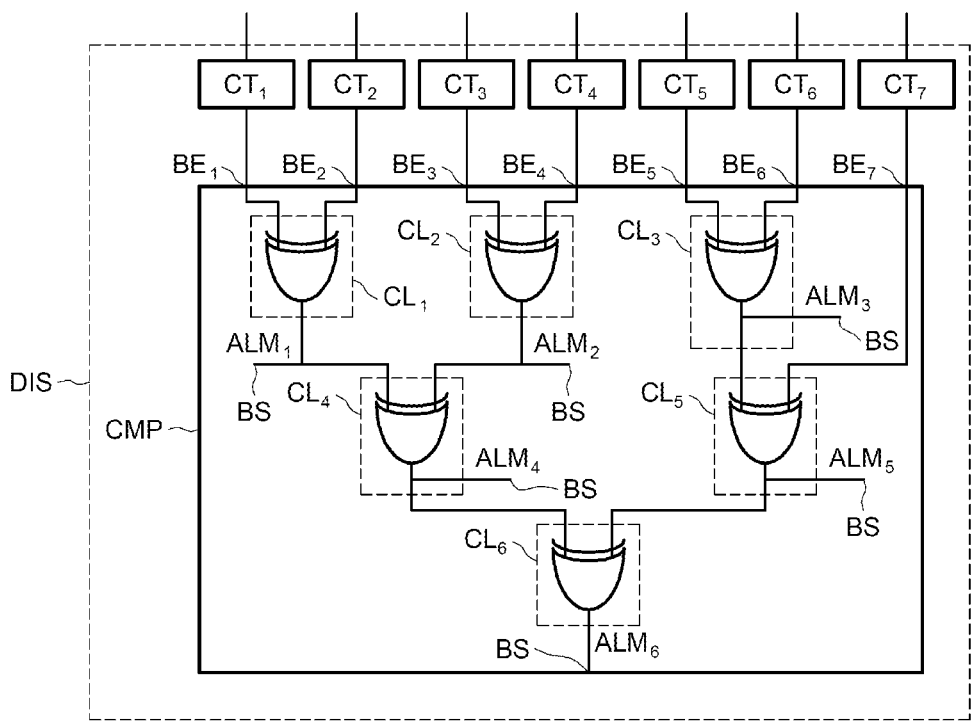

Alternatively, it would be possible, as illustrated in FIG. 5, for the outputs of each of the logic gates to be coupled to the output terminal BS of the comparator CMP, for example via a logic module (not shown), making it possible to combine the outputs of all of the logic gates on the output terminal BS. Each signal delivered by a logic gate thus forms an alarm signal in this case.

Figure 6:
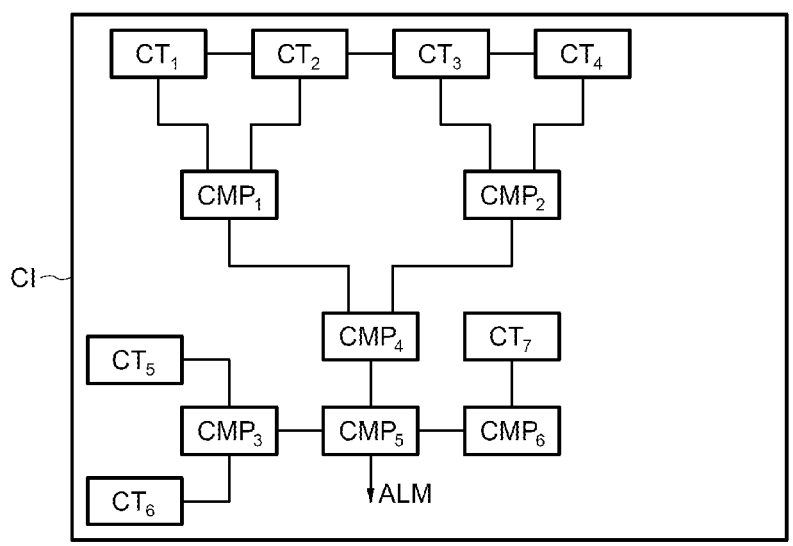

It would furthermore be possible, as illustrated in FIG. 6, for the logic circuits $CL_j$ of the comparator to be distributed over the entire surface area of the integrated circuit CI, so as to be closer to the timers $CT_i$. This advantageously makes it possible to limit the lengths of connections between the detection elements in the circuit.

Figure 7:
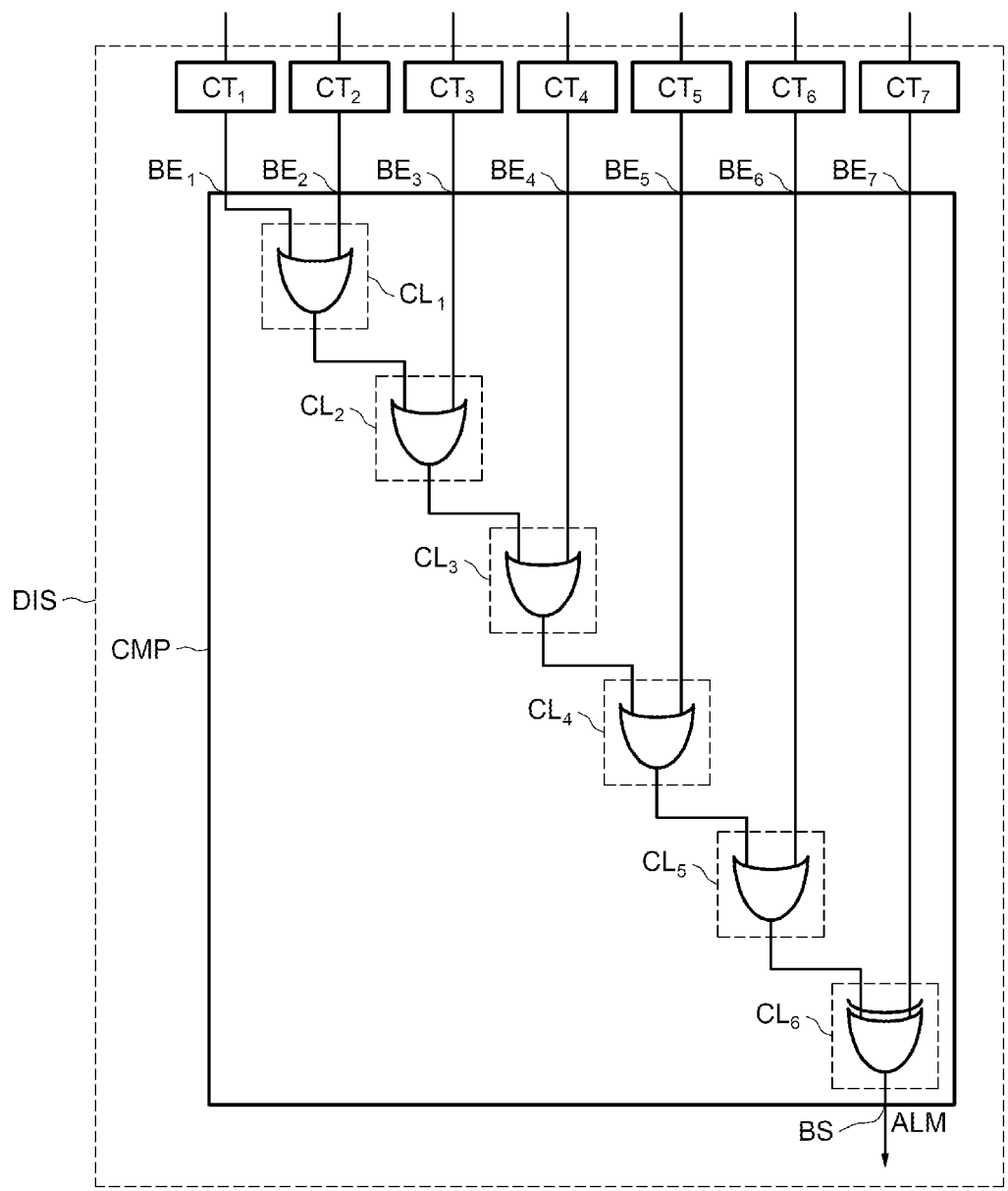

According to one embodiment illustrated in FIG. 7, the logic circuits $CL_j$, in this case logic gates, are connected in cascade in a series structure. Each logic circuit $CL_j$ thus has its output coupled to the input of the logic circuit $CL_{j+1}$ that follows it in the series, with the exception of the terminal logic circuit $CL_6$ the output of which is coupled to the output terminal BS of the comparator CMP.

The comparator CMP includes an initial logic gate $CL_1$, forming the first logic gate of the series of logic gates, and the inputs of which are coupled to the first timer $CT_1$ and to the second timer $CT_2$, and the output of which is coupled to a following logic gate $CL_2$.

All of the logic circuits $CL_j$, with the exception of the initial logic circuit $CL_1$, have a first input coupled to an output of a logic circuit $CL_{i-1}$ preceding it in the series of logic circuits, and a second input coupled to a separate timer $CT_i$.

The terminal logic gate, in this case an Exclusive OR logic gate, is coupled to the output terminal BS of the comparator CMP and is configured so as to deliver the alarm signal ALM.

All of the logic gates, with the exception of the terminal logic gate, are OR logic gates in this case.

Each logic gate is thus configured so as to perform a comparison and so as to transmit, to the following logic gate, a signal containing information on the phase offset or absence of phase offset of the pulse signals that have already been compared.

In this case, the information on the phase offset or absence of phase offset of the pulse signals is contained in the duration of the high states at the output of the OR logic gates.

For example, if the first and second pulse signals $CT_1$ and $CT_2$ are not phase-offset, the initial logic gate will generate a pulse equivalent in duration to a pulse of the pulse signals generated by the timers.

A high state at the output of an OR logic gate the duration of which is equal to the duration of a high state of a pulse of a pulse signal is therefore information that indicates an absence of phase offset.

If the first and second pulse signals $CT_1$ and $CT_2$ are phase-offset in accordance with the illustration of FIG. 2, the initial logic gate $CL_1$ will generate, at output, a pulse the duration of which is equal to the duration of a pulse of a pulse signal $SCT_i$, plus the duration Δ, that is to say a duration of T1-T2 in this case.

In this case, a high state at the output of a logic gate the duration of which is equal to the duration of a high state of a pulse of a pulse signal plus the duration Δ is information that indicates the presence of a phase offset.

This additional duration Δ that forms information indicating that two signals have been phase-offset will be transmitted from one OR logic gate to another, whether or not another pulse signal exhibits a phase offset, as far as the terminal logic circuit $CL_6$.

When the terminal logic circuit compares the signals on its inputs, if no phase offset has occurred, the terminal logic circuit $CL_6$, in this case an Exclusive OR logic gate, generates the alarm signal ALM having a low state.

By contrast, if the two signals are phase-offset or if the two signals are pulses having different durations, then it will deliver the alarm signal ALM having a high state.

In the example of FIG. 7, the logic circuits, with the exception of the terminal logic circuit, include OR gates.

It would be possible however to contemplate other types of logic circuit, for example Exclusive OR gates.

Figure 8:
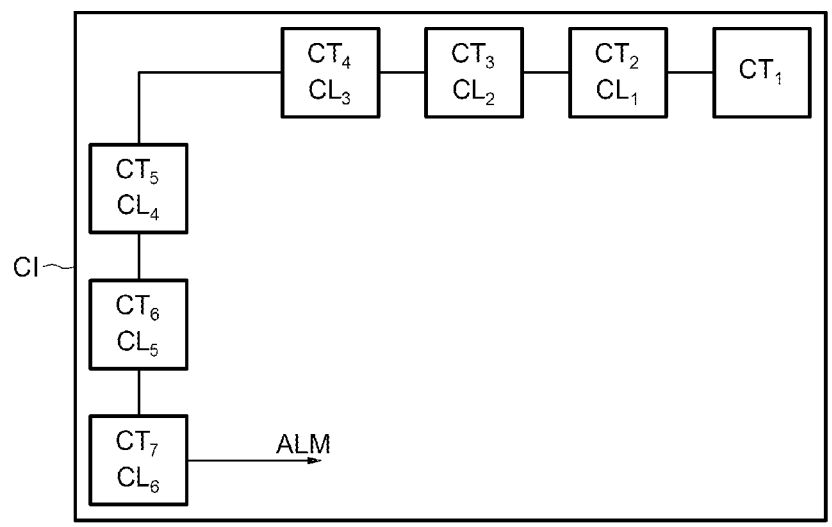

FIG. 8 schematically illustrates a plan view of an integrated circuit in which the device is in accordance with the embodiment of FIG. 7 described above and considered in a general manner with regard to the structure of the logic circuits $CL_i$.

The series coupling of the comparator elements advantageously allows better optimization of the occupation of the surface area of the integrated circuit CI, and makes it possible to avoid the signals from the logic gates travelling excessively long distances.

Figure 9:
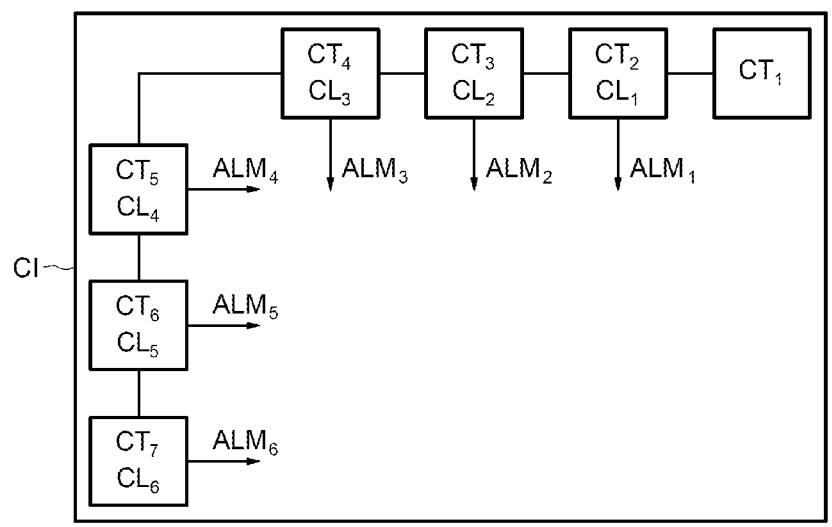

FIG. 9 illustrates one variant of the embodiment described above with reference to FIGS. 7 and 8, wherein each logic circuit $CL_j$ is configured so as to generate an alarm signal ALM.

According to this embodiment, each logic circuit comprises a plurality of logic gates. A person skilled in the art will know how to choose the appropriate logic circuit configuration according to the applications under consideration.

Figure 10:
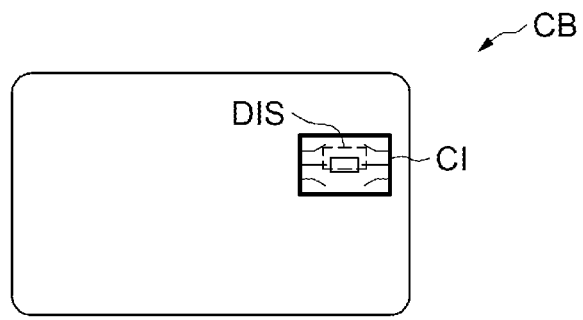
Figure 11:
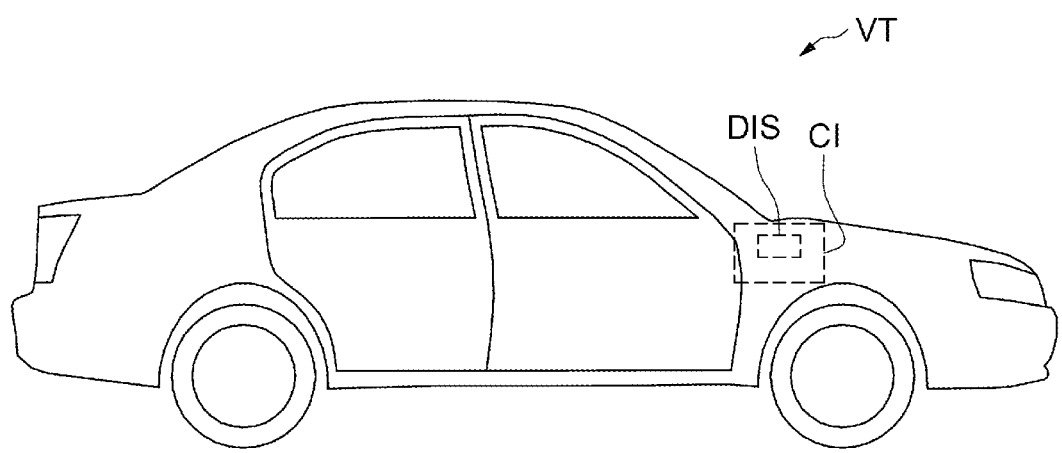

The integrated circuit such as described above with reference to FIGS. 1 to 7 may be integrated into any type of system, such as for example a chip card CB such as the one illustrated in FIG. 10, or else into an electronic system of a motor vehicle VT such as the one illustrated in FIG. 11. Other examples of secure products include identify documents such as passports, tags for products as printer cartridges, and others.

While illustrated as a physical card in FIG. 10, it is understand that the chip card need not be an actual card. As an example SIM-card for mobile phones or IoT devices may be replaced by so-called "embedded SIM" where the secured chip is directly soldered to the product board. Same soldered SIM circuits may be used in automotive for connectivity.

What is claimed is:

1. An electronic circuit comprising:
   a clock signal generator configured to deliver a clock signal;
   a propagation circuit configured to propagate the clock signal on a plurality of propagation branches;
   a plurality of timers coupled to at least some of the branches, the timers clocked by corresponding replicas of the clock signal and configured to generate a pulse signal every N pulses of the corresponding replica of the clock signal; and
   a comparator configured to generate an alarm signal having a first state when two of the pulse signals are phase-offset with respect to one another, wherein the comparator comprises:
   a plurality of input terminals,
   a single output terminal that is configured to deliver the alarm signal, and
   a plurality of logic circuits connected in cascade, each input terminal of the comparator being coupled to a separate input of a logic circuit.

2. The electronic circuit according to claim 1, wherein each logic circuit includes a single output, the logic circuits being connected in series such that an initial logic circuit has inputs coupled to two separate timers, and that the other logic circuits have one input coupled to the output of a separate logic circuit and a second input coupled to a separate timer, a terminal logic circuit having an output coupled to the output terminal.

3. The electronic circuit according to claim 2, wherein the terminal logic circuit is an Exclusive OR logic gate, and the other logic circuits are OR logic gates.

4. The electronic circuit according to claim 1, wherein each logic circuit has an output coupled to the output terminal and is configured to generate an alarm signal.

5. The electronic circuit according to claim 1, wherein the logic circuits each include a single output and are coupled in a tree structure.

6. The electronic circuit according to claim 5, wherein the logic circuits are Exclusive OR gates, and wherein the output of a terminal logic circuit is coupled to the output terminal.

7. The electronic circuit according to claim 6, wherein the output of each logic circuit is coupled to the output terminal.

8. The electronic circuit according to claim 1, wherein the electronic circuit is part of an electronic system of a motor vehicle.

9. The electronic circuit according to claim 1, further comprising a storage medium containing secure data, wherein the alarm signal is to indicate an issue regarding security of the secure data.

10. The electronic circuit according to claim 9, wherein the electronic circuit is part of a chip card.

11. The electronic circuit according to claim 10, wherein the chip card includes a physical card.

12. An electronic circuit comprising:
   a clock signal generator configured to deliver a clock signal;
   a plurality of timers, each timer having an input coupled to an output of the clock signal generator; and
   a plurality of logic circuits connected in cascade, each logic circuit having a first input, a second input and an output and each timer having an output coupled to a logic circuit, wherein for each logic circuit the first input is coupled to the output of an associated timer or the output of another one of the logic circuits and wherein for each logic circuit the second input is coupled to the output of a second associated timer or the output of a different another one of the logic circuits.

13. The electronic circuit according to claim 12, wherein the timers are coupled to be clocked by corresponding replicas of the clock signal and configured to generate a pulse signal every N pulses of the corresponding replica of the clock signal.

14. The electronic circuit according to claim 13, wherein an output of one of the logic circuits is used as an output of the electronic circuit, the output configured to provide an alarm signal having a first state when two of the pulse signals are phase-offset with respect to one another.

15. The electronic circuit according to claim 12, further comprising additional circuitry, wherein an output of one of the logic circuits is used as an output of the electronic circuit that is configured to provide an alarm signal indicative of a security issue regarding the additional circuitry.

16. The electronic circuit according to claim 12, wherein each logic circuit includes a single output, the logic circuits being connected in series such that an initial logic circuit has inputs coupled to two separate timers, and that the other logic circuits have one input coupled to the output of a separate logic circuit and a second input coupled to a separate timer, a terminal logic circuit having an output coupled to an output terminal of the electronic circuit.

17. The electronic circuit according to claim 12, wherein the logic circuits each include a single output and are coupled in a tree structure.

18. A method for detecting an anomaly in a clock signal, the method comprising:
propagating replicas of a clock signal on a plurality of branches of a propagation circuit;
generating pulse signals at ends of at least some of the branches of the propagation circuit, the pulse signals being generated every N pulses of the corresponding replica; and
detecting a mutual phase offset between two of the pulse signals by using a plurality of logic circuits connected in cascade, each of the plurality of logic circuits having an input for receiving a respective pulse signal of the pulse signals, the phase offset being representative of the presence of an anomaly in the clock signal.

19. The method according to claim 18, further comprising generating an alarm signal based on the presence of an anomaly in the clock signal, the alarm signal being indicative of potential security breach.

20. The method according to claim 18, wherein N is equal to 3, 8, or 16.

21. The method according to claim 18, wherein the logic circuits each include a single output and are coupled in a tree structure.

22. The electronic circuit according to claim 1, wherein the plurality of timers are distributed across a surface area of an integrated circuit.

\* \* \* \* \*